(12) United States Patent
Freeman

(10) Patent No.: US 6,864,517 B2
(45) Date of Patent: Mar. 8, 2005

(54) BIPOLAR STRUCTURE WITH TWO BASE-EMITTER JUNCTIONS IN THE SAME CIRCUIT

(75) Inventor: Gregory G. Freeman, Hopewell Junction, NY (US)

(73) Assignee: International Business Machines Corporation, Armonk, NY (US)

(*) Notice: Subject to any disclaimer, the term of this patent is extended or adjusted under 35 U.S.C. 154(b) by 77 days.

(21) Appl. No.: 10/342,424

(22) Filed: Jan. 14, 2003

(65) Prior Publication Data

US 2004/0135137 A1 Jul. 15, 2004

(51) Int. Cl.[7] .......................................... H01L 31/0328
(52) U.S. Cl. ........................ 257/192; 257/20; 257/27; 257/76; 257/183
(58) Field of Search ...................... 257/20, 27, 76–78, 257/183–201

(56) References Cited

U.S. PATENT DOCUMENTS

| | | | |
|---|---|---|---|
| 5,834,800 A | 11/1998 | Jalali-Farahani et al. | ... 257/198 |
| 6,222,249 B1 | 4/2001 | Osborne et al. | ............ 257/571 |
| 6,346,453 B1 | 2/2002 | Kovacic et al. | ............ 438/312 |
| 6,750,483 B2 * | 6/2004 | Klein et al. | ................. 257/198 |
| 2002/0070410 A1 | 6/2002 | Freeman et al. | ............ 257/370 |
| 2004/0084692 A1 * | 5/2004 | Ning | .......................... 257/197 |

* cited by examiner

*Primary Examiner*—Nathan J. Flynn
*Assistant Examiner*—Scott R Wilson
(74) *Attorney, Agent, or Firm*—Joseph P. Abate; Eric W. Petraske

(57) ABSTRACT

Bipolar integrated circuits employing SiGe technology incorporate the provision of mask-selectable types of bipolar transistors. A high-performance/high variability type has a thin base in which the diffusion from the emitter intersects the base dopant diffusion within the "ramp" of Ge concentration near the base-collector junction and a lower performance/lower variability type has an additional epi layer in the base so that the emitter diffusion intersects the Ge ramp where the ramp has a lower ramp rate.

7 Claims, 4 Drawing Sheets

# BIPOLAR STRUCTURE WITH TWO BASE-EMITTER JUNCTIONS IN THE SAME CIRCUIT

TECHNICAL FIELD

The field of the invention is that of bipolar transistors, in particular transistors using Si and Ge.

BACKGROUND OF THE INVENTION

It has been found that, in order to create a high performance SiGe bipolar transistor, the Ge profile in those transistors has to have a rapidly increasing concentration, or "ramp", from a low concentration in the vicinity of the emitter-base junction to a higher concentration (e.g. 20–30% mole fraction) within the neutral base of the device. An increase in the Ge concentration creates a change in the band structure of the crystal, which defines an electric field across a portion of the neutral base. This electric field substantially accelerates the carriers to cross the device in a short time, and thus improves the high frequency gain of the device.

Thus the need to improve switching speed has driven an increase in the ramp rate, in order to increase the electric field in the neutral base, accelerating the carriers to high velocity in as short a distance as possible. As is also well known, a second effect of the Ge at the emitter-base junction is to reduce the conduction band potential at that location, and thus increase the quantity of electrons injected from the emitter into the neutral base. This electron injection comprises the collector current, which is a quantity that needs to be well controlled so that the behavior of the bipolar device, and thus the performance of the circuit, is predictable. The complicating factor is that the emitter junction depth is variable with normal process variations (e.g., emitter and base dopant concentration variation, interface variability, and temperature repeatability and uniformity).

Relative to the Ge ramp, the process variations in the emitter-base junction depth result in variations in the Ge percentage at that junction location, and thus collector current is found to be variable. Because the dependence of collector current on Ge percentage is exponential, this effect is observed to be large (at least a range of +−50 percentage of the nominal value).

Thus there is a tradeoff. Higher Ge ramp rates increase the speed of the bipolar transistor, yet the same higher ramp rates increase the variability of the collector current in the device.

There remains a need for providing the designers an option to improve tolerance.

It is well known that performance may be traded off with collector avalanche and breakdown voltage through mask-selectable modifications in collector design on the same chip. Commonly, this is accomplished through implantation through or before the epitaxy layer, or blocking this implant with a photoresist layer. Other inventors have seen appropriate to form completely different base epitaxy regions on a chip, through mask-selectable regions of exposed single-crystal collector prior to epitaxy growth. The base epitaxy in such a solution includes different collector, base, and emitter regions. Such a solution has drawbacks of process complexity resulting from the multiple critical film growth, longer process times from the lengthy growth of relatively thick films, and process control issues resulting from the completely separate devices.

SUMMARY OF THE INVENTION

The invention relates to bipolar transistors using Si-Ge material.

A feature of the invention is the presences of two types of bipolar SiGe transistor in the same integrated circuit.

Another feature of the invention is a mask-selectable alternate base-emitter junction.

Another feature of the invention is a high performance/poor tolerance device structure, having a base dopant of a lower total dose, and an emitter diffusion that intersects the base dopant within the steep germanium ramp.

Yet another feature of the invention is a low performance/improved tolerance device structure, in which the base dopant has a greater total dose and the emitter diffusion intersects the base dopant at a more constant (or at zero) germanium concentration.

DETAILED DESCRIPTION

This invention provides a mask-selectable alternate base-emitter junction that provides the designer with an additional choice in trading off performance for improved tolerance to process variations. In the case of a high performance/high variability device structure, the base dopant is of a lower total neutral base dose, (e.g. $1\times10^{13}/cm^2$–$1\times10^{14}/cm^2$) and the emitter diffusion intersects the base dopant within the steep germanium ramp. This structure provides high performance, but at the cost of high susceptibility to process variations because of the exponential dependence of collector current on Ge concentration.

In the case of a low performance/improved tolerance device structure, the base dopant has a greater total dose, (e.g. from only 10% higher dose to ten time the dose) and the emitter diffusion intersects the base dopant at a more constant (or at zero) germanium concentration.

The structure has a collector that incorporates an epitaxial SiGe film which is identical between the two devices, except that in the lower performance/improved tolerance device, there is an additional boron dose nearer to the surface of the original boron dose, and a thin (2–30 nm thick) epitaxial layer added on top of the SiGe film that makes up the higher performance device. The terms improved tolerance (to process variations) and lower variability (to process variations) will be used interchangeably.

Figure 1A:
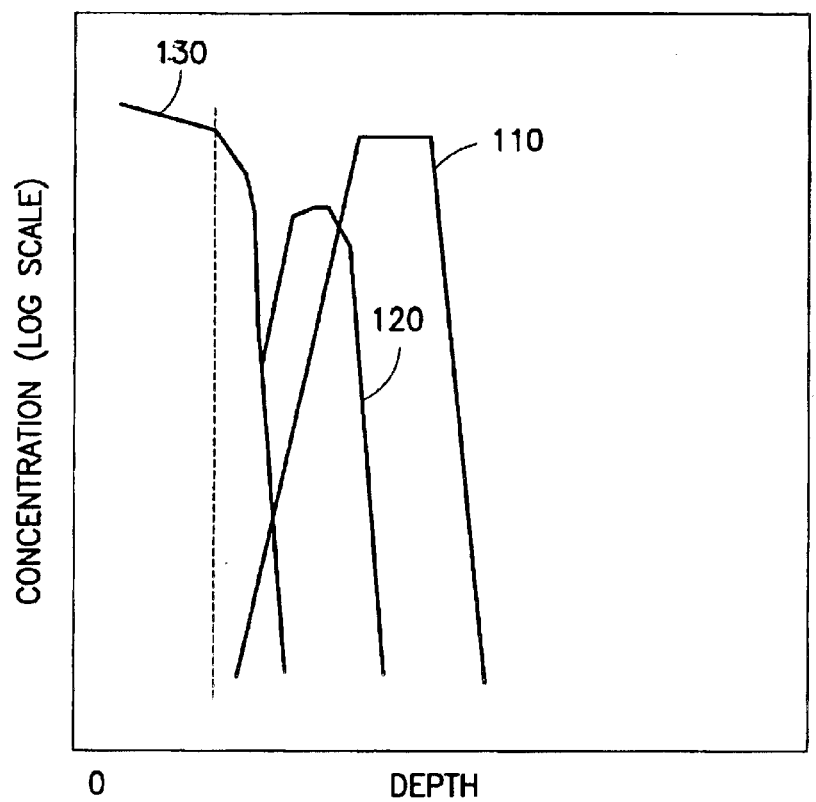
FIG. 1a shows a graph of the dopant concentration in a prior art device.
Figure 1B:
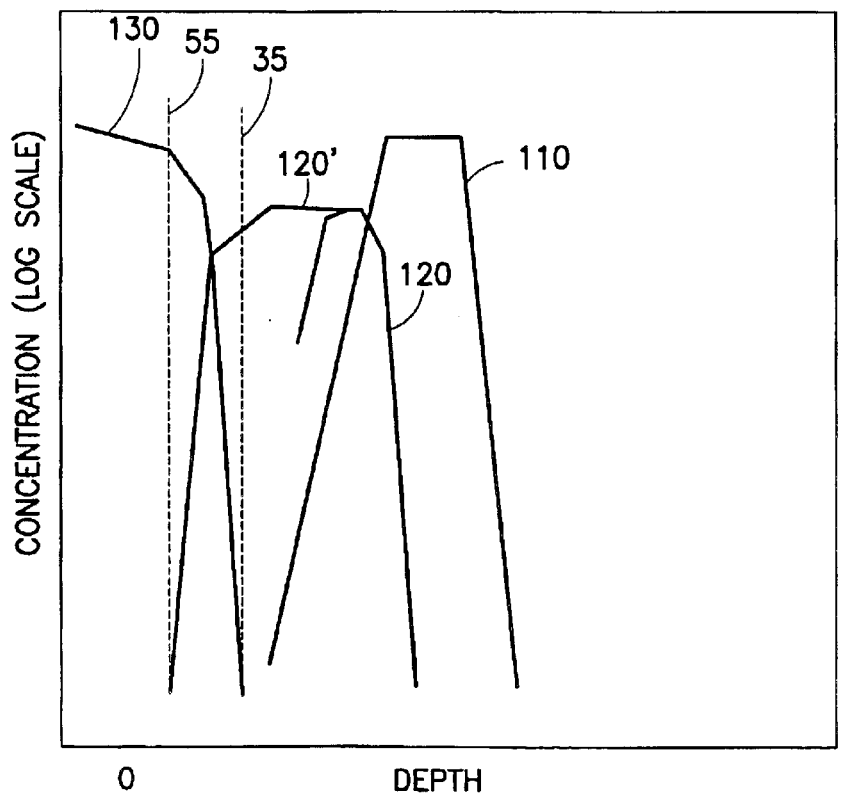
FIG. 1b shows a graph of the dopant concentration in a device according to the invention.

Shown in FIG. 1 is an example profile for a high performance n-p-n SiGe bipolar device. FIG. 1a illustrates the high performance device profile which in itself may be viewed as the prior art. The notable feature is that the emitter dopant 130 (typically arsenic or phosphorous) is at a depth which overlaps the germanium ramp 110. This serves to substantially reduce the transit time of the injected carriers across the base region of the device. The profile illustrated in FIG. 1b, which exists on the same wafer as the profile in FIG. 1a, contains the same germanium ramp, and the same original boron profile as that shown in FIG. 1a. Added to the original profile is a thin (2–30 nm) epitaxy layer between vertical lines 35 and 55 and an additional boron dopant 120' that extends the boron curve to the left.

This combination pushes the emitter junction further from the germanium ramp (to the left) such that it does not intersect the ramp and thus does not have the variable transistor parameters that result from the variable germanium concentration at the location of the junction with process variations in junction depth.

Figure 2A:
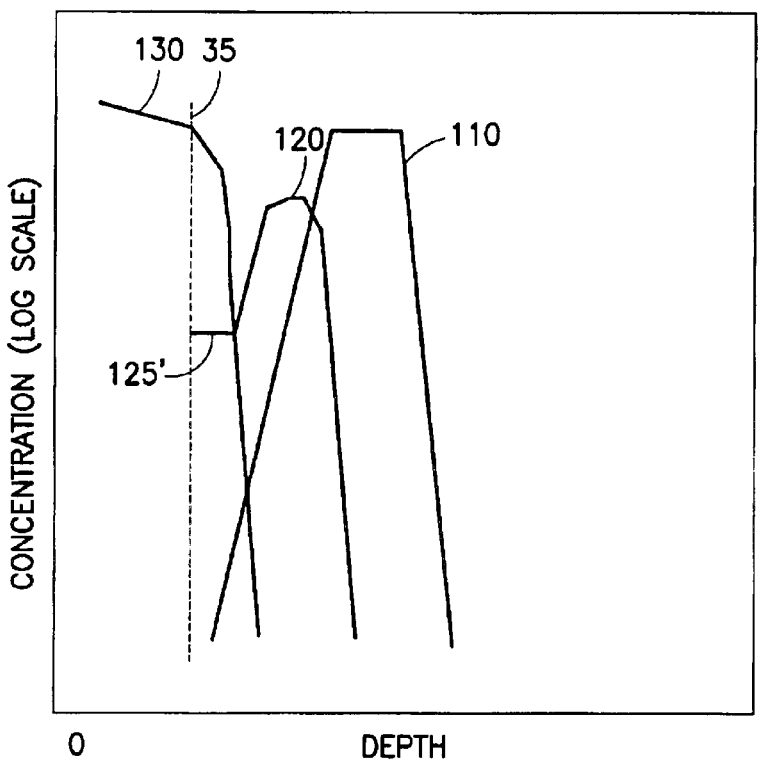
FIGS. 2a and 2b show graphs of the dopant concentration in two alternative devices according to the invention.
Figure 2B:
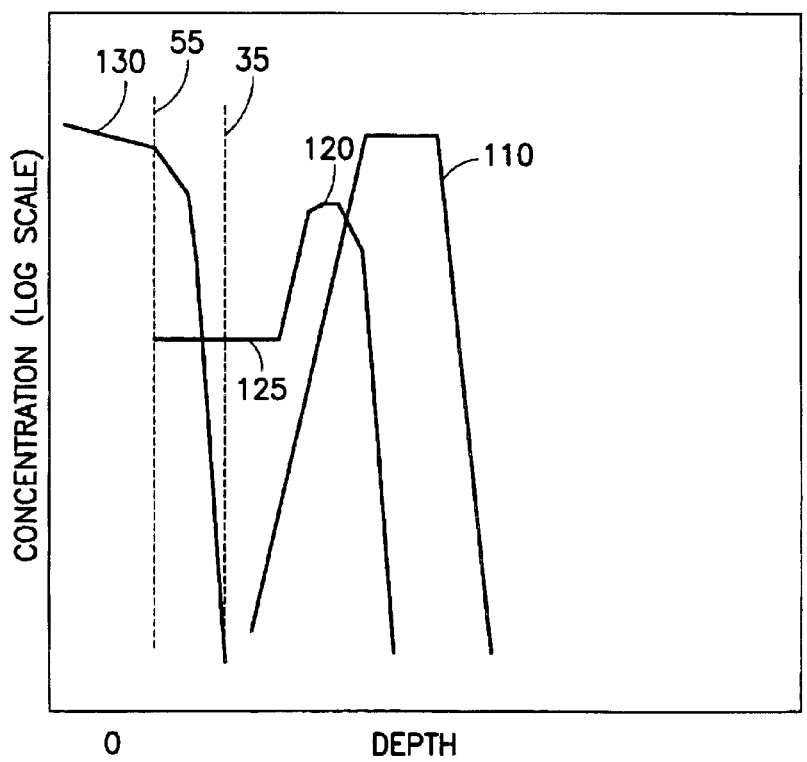

Concentration curves for a second embodiment of this invention are shown in FIG. 2. FIG. 2a shows the data for a high performance structure and FIG. 2b shows the corresponding data for the low variability structure. This curve differs from the prior example in the source of the additional boron dose. Here, the epitaxy growth includes additional boron dopant (the portion of curve 125 between lines 35 and 55) which is a sufficiently low concentration to be compensated by the emitter dopant in the high performance/poor tolerance device in FIG. 2a, and serves as a base dopant in the lower performance/improved tolerance device of FIG. 2b. Thus, the extra boron dose is implanted in the first embodiment, and deposited during the epitaxy steps in the second embodiment, yet serves the same function in the two embodiments. Like the previous example, the emitter-base junction in FIG. 2b does not intersect the germanium on some devices on the wafer, and thus has improved control.

The important aspect of the emitter dopant—Ge overlap is that at the intersection of the emitter dopant curve and the Ge concentration curve, the ramp rate, or change in the Ge concentration, should be greater than a threshold value in the high performance embodiment. Those skilled in the art are aware that intersection of the curves at a depth (or vertical location in the structure) where the Ge concentration is constant as a function of vertical position will not have a significant beneficial effect on performance. In current processing an appropriate threshold value is a concentration ramp rate of 5% per 100 Angstroms. Different processes may have slightly different values of the threshold.

Figure 3:
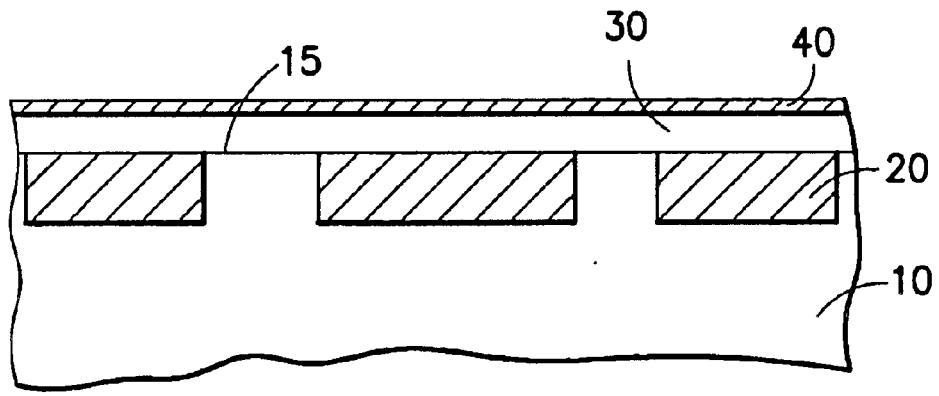
FIG. 3 shows the result of preliminary steps in fabricating the invention.

One method to accomplish the previously described structure is next discussed with respect to FIG. 3. Those skilled in the art will readily be able, in the light of this disclosure to devise other methods of providing the structure shown. The initial steps in the transistor fabrication process are the provision of preparation steps, such as blanket doping, forming isolation members to separated devices, pad oxide and/or nitride, etc. that will be referred to in the claims as preparing the substrate. In this case, shallow trench isolation (STI) members 20 have been formed in substrate 10 and a uniform layer of SiGe 30 has been put down. The SiGe film typically contains both the boron dopant 120 of FIG. 1a and the Ge ramp profile 110 of FIG. 1a. It is commonly found that a SiGe film is deposited across the wafer (i.e., blanket), and grows epitaxially (i.e., with the underlying crystal structure) through a patterned opening where the NPN transistor will be fabricated, and polycrystalline in other areas. The SiGe film growth is followed by a passivation film growth or deposition, which is commonly silicon dioxide 40 of approximately 5–20 nm in thickness. Film 40 may have deposited on top additional films, such as polycrystalline silicon, which may aid later process steps, and for simplicity purposes are not shown here. This structure, including the shallow-trench isolation, is shown in FIG. 3.

Figure 4:
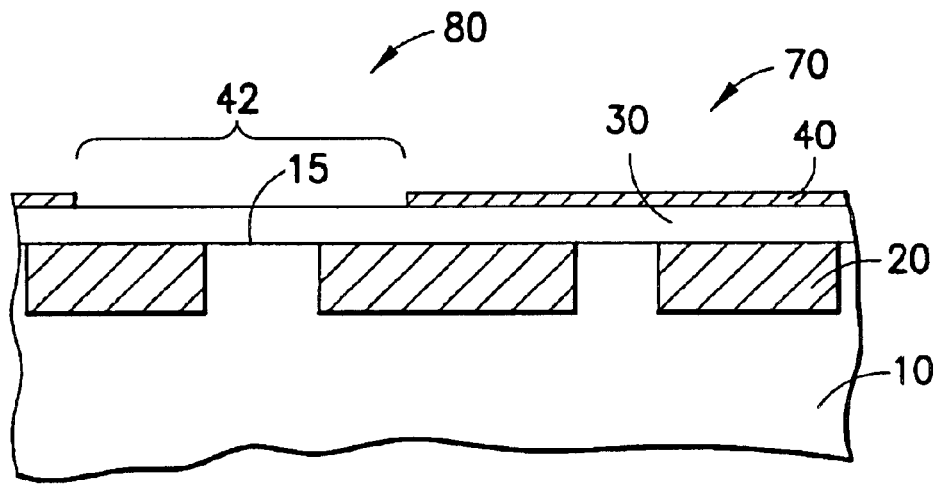
FIGS. 4–6 show the result of intermediate steps in fabricating the invention.

FIG. 4 shows an example of insulating film 40 which has been patterned with photoresist to form an opening denoted by bracket 42 over the lower performance/improved tolerance device (denoted generally by numeral 80), and where the insulating film 40 has been etched down to the silicon surface, and the resist removed. On the right in the Figure, numeral 70 denotes generally the area where the higher performance transistor will be formed.

Figure 5:
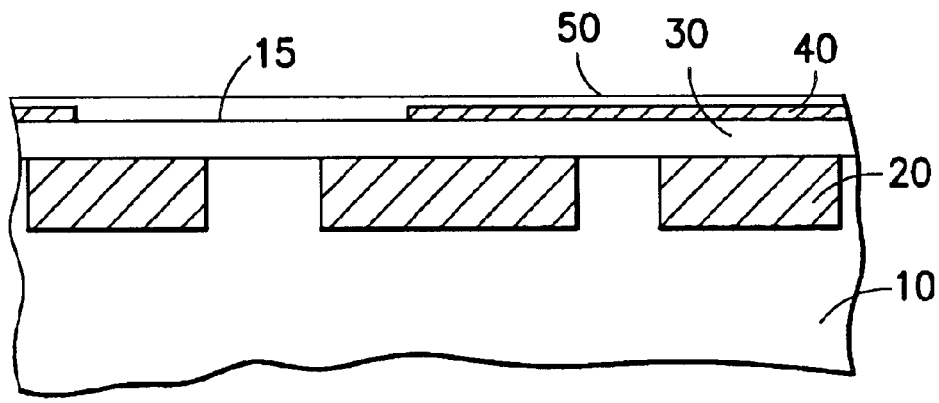
Figure 6:
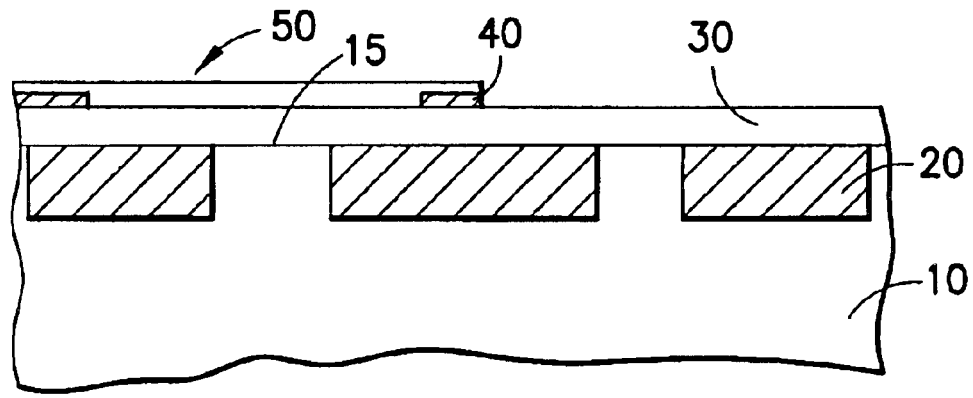

FIG. 5 shows these areas following the epitaxial deposition of the second (silicon) epitaxy film, where this film forms as single crystal over the lower performance/improved tolerance device, and may form as polycrystalline silicon over the insulating film. Alternatively, the second epitaxy film may be grown as a selective epitaxy, where the film is grown only over the insulating film opening. At this point, a blanket (unmasked) boron implant may be applied to form the additional base dopant 125 shown in FIG. 2b. Following this step, a photoresist is applied and the epitaxy film and the insulating film are removed in regions except the regions 80 of the lower performance/improved tolerance device, as shown in FIG. 6.

Figure 7:
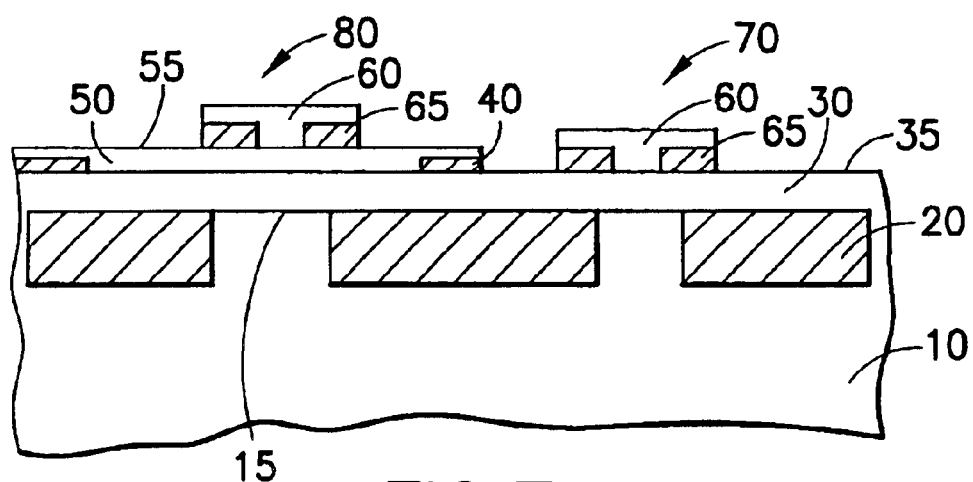
FIG. 7 shows two completed embodiments of the invention.

At this point, the surface of both device types is exposed, and processing can continue with standard passivation, dielectric films, and emitter film deposition and patterning. The result is shown in FIG. 7, with top surface 35 of SiGe film 30 and top surface 55 of silicon film 50 (having the dopant concentration shown in FIGS. 1 and 2). Polysilicon emitters 60, with emitter-base isolation defined by dielectric 65 (oxide or nitride) have been formed simultaneously in both transistors. Thus the two emitters-base junctions are formed.

The circuit will be completed by patterning the base film 30, providing electrodes to the emitter, base and collector (not shown) and connecting the transistors according to the particular schematic being implemented, by techniques known to those skilled in the art.

The same first SiGe base epitaxy, collector, and emitter process is used for both transistors. The difference is an additional epitaxy layer on top of the shared SiGe base layer for device 80 which is not part of the second device 70 and corresponding changes in the dopant distribution.

Those skilled in the art will appreciate that various modifications can be made to the embodiment illustrated. As one example, the second epitaxy film may be deposited by a selective epitaxy process following the etch of film 65 to form the emitter opening. Selection of the emitter-base properties may be made by utilizing two separate emitter opening masks. For generality, the following claims will refer to a crystalline siliconlayer, independent of the method for masking and deposition Complementary circuits may be fabricated by applying the same technique to the construction of PNP bipolar transistors, using the conventional substitution of dopants. The result is a set of mask-selectable high performance and low variability transistors for both PNP and NPN versions.

Those skilled in the art will appreciate that the germanium profile may be a constant ramp rate as depicted in FIG. 1, or may be a profile with different ramp slopes in order to optimize the performance of the two device types described in this invention.

While the invention has been described in terms of a single preferred embodiment, those skilled in the art will recognize that the invention can be practiced in various versions within the spirit and scope of the following claims.

What is claimed is:

1. An integrated circuit comprising selected bipolar transistors from a first set of bipolar transistors and a second set of bipolar transistors formed in a semiconductor substrate;

a SiGe layer formed on said semiconductor substrate;

said first set of bipolar transistors formed in said substrate having a collector;

a base formed in a base layer layer of crystalline silicon material which includes a base dopant and Ge and an emitter disposed above and abutting said base, in which an emitter dopant concentration intersects a Ge concentration at a depth into the base where the ramp rate of said Ge concentration is greater than a threshold value;

said second set of bipolar transistors formed in said substrate having a collector;

a base formed in said layer of crystalline silicon material which includes said base dopant and Ge; an additional layer of crystalline silicon material on second set of bipolar transistors, disposed above and abutting said base; and an emitter disposed above and abutting said additional layer of crystalline silicon material, in which an emitter dopant concentration intersects the base at a different vertical location relative to said Ge concentration where the ramp rate of said Ge concentration is less than a threshold value.

2. An integrated circuit according to claim 1, in which said Ge concentration at said different location where said emitter dopant concentration intersects the base is substantially zero.

3. An integrated circuit according to claim 1, in which said bases in said first set and in said second set are formed of a first epitaxial layer of material and said bases in said second set further comprise a second epitaxial layer of material disposed above said first epitaxial layer, thereby separating said emitter from said MGe SiGe layer by a longer distance.

4. An integrated circuit according to claim 2, in which said bases in said first set and in said second set are formed of a first epitaxial layer of material and said bases in said second set further comprise a second epitaxial layer of material disposed above said first epitaxial layer, thereby separating said emitter from said SIGe SiGe layer by a longer distance.

5. An integrated circuit according to claim 3, in which said first and said second sets of bipolar transistors comprise NPN transistors.

6. An integrated circuit according to claim 3, in which said first and said second sets of bipolar transistors comprise PNP transistors.

7. An integrated circuit according to claim 3, in which each of said first and said second sets of bipolar transistors comprise both NPN and PNP transistors.

* * * * *